United States Patent [19]

Barton

[11] Patent Number: 4,545,852
[45] Date of Patent: Oct. 8, 1985

[54] PLANARIZATION OF DIELECTRIC FILMS ON INTEGRATED CIRCUITS

[75] Inventor: Donald L. Barton, Corvallis, Oreg.

[73] Assignee: Hewlett-Packard Company, Palo Alto, Calif.

[21] Appl. No.: 622,439

[22] Filed: Jun. 20, 1984

[51] Int. Cl.[4] .................. B44C 1/22; C03C 15/00; C03C 25/06; B29C 17/08
[52] U.S. Cl. ..................... 156/643; 156/646; 156/652; 156/653; 156/655; 156/657; 156/668; 204/192 E; 427/88
[58] Field of Search ............... 156/643, 646, 652, 653, 156/655, 657, 659.1, 662, 668; 427/88, 89, 90, 93, 94; 430/313, 314, 317; 204/192 EC, 192 E

[56] References Cited

U.S. PATENT DOCUMENTS 4,377,438  3/1983  Moriya et al. .................. 156/345 X

OTHER PUBLICATIONS

IBM Technical Disclosure Bulletin, vol. 22, No. 2, Jul. 1979, Method for Forming a Flat SiO2 Topology in Multilevel Structures, K. Chang, pp. 543–544.
Rothman, L. B., Process for Forming Passivated Metal Interconnection System with a Planar Surface, Journal of the Electrochemical Society: Solid State Science and Technology, vol. 130, No. 5, May 1983, pp. 1131–1136.
Hazuki, Y., Moriya, T., Kashiwagi, M., A New Application of RIE to Planarization and Edge Rounding of SiO2 Hole in the Al Multi-level Interconnection, published in the 1982 Symposium on VLSI Technology, pp. 18–19.
Adams, A. C., Plasma Planarization, published in Solid State Technology, Apr. 1981, pp. 178–181.

Primary Examiner—William A. Powell
Attorney, Agent, or Firm—Jeffery B. Fromm; Cheryl L. Shavers

[57] ABSTRACT

A method for planarizing dielectric films between conductive layers on semiconductor wafers is disclosed. Two successive dielectric layers are deposited over a pattern on a wafer and coated with a polymer which has a substantially flat surface. Planarization is obtained when the wafer is plasma etched with the etch rate of the polymer equal to the etch rate of the second dielectric layer. The etch is stopped when all of the polymer has been removed from the wafer. Selectivity in etch rates between the first and second dielectric layers reduces the problems of nonuniformities and the formation of pin holes in the first dielectric layer.

9 Claims, 4 Drawing Figures

4,545,852

PLANARIZATION OF DIELECTRIC FILMS ON INTEGRATED CIRCUITS

BACKGROUND

This invention relates to a method for planarizing dielectric films between conductive layers on semiconductor wafers which are for use in the fabrication of integrated circuits.

The increase of circuit density on silicon chips necessitates increased ability to interconnect large numbers of integrated silicon devices on a single chip. The dimensional limitation of the active area in an integrated circuit dictates that vertical interconnections be made by means of multilevel metallization. As the circuits become denser, and the feature sizes smaller, the topography becomes too sever for conventional multilevel metallization structures to provide acceptable yield or to have acceptable reliability. It has been found that planarizing the dielectric between the metal interconnect layers improves the metal patterning and step coverage. This improved metal patterning and step coverage allows the use of multilevel metallization of large scale (LSI) and very large scale (VLSI) integrated circuits.

Recently, polyimide has been used to provide a flat surface for the next level of metallization as described in an article entitled "Process for Forming Passivated Metal Interconnection System with a Planar Surface" by L. B. Rothman published in the Journal of the Electrochemical Society: Solid State Science and Technology, Volume 130, Number 5, May 1983. However, one drawback of using polyimide is that in order to achieve planarization, a relatively thick layer of polyimide (e.g., 2.0 microns) must be used. It is difficult to etch small vias (<3.0 microns) through this thick dielectric and even more difficult for metal to cover these deep via holes. There are also concerns about the polyimide adhering to the wafer and subsequent films adhering to the polyimide resulting in potential yield and reliability problems.

Another planarization technique described in an article entitled "A New Application of RIE to Planarization and Edge Rounding of $SiO_2$ Hole in the Al Multilevel Interconnection" by Y. Hazuki, T. Moriya and M. Kashiwagi published in the 1982 Symposium on VLSI Technology, uses reactive ion etching (RIE) to provide a flat surface for the next level of metallization. A layer of $SiO_2$ and SiN is deposited over the first level of metallization. Then a RIE is performed using $CF_4+H_2$ which etches the SiN and $SiO_2$ at the same rate. The etch is stopped when all of the SiN is removed. After the RIE, a 1.0 micron thick $SiO_2$ layer is deposited. One limitation of this process is that planarization only occurs where the steps are spaced close together (i.e. <2.0 microns). Thus, steps that are not spaced close together will not benefit from this planarization technique. Furthermore, after the planarization another deposition of silicon dioxide is required which adds processing time and complexity.

Additionally, a planarization technique described in an article entitled "Plasma Planarization" by A. C. Adams, published in Solid State Technology, April 1981, disclosed the deposition of a single layer of $SiO_2$ over the first level of metal which is then coated with a layer of resist. Since the surface of the resist is almost flat, the resist is thinner over the metal steps. Plasma etching is then performed in such a way that the etch rates of the resist and the dielectric are equal. As the unpatterned resist is etched, the dielectric on top of the metal steps is removed but the dielectric between the metal steps is protected by the resist. Stopping the etch when all of the resist is removed results in a nearly flat surface for the next level of metal. One drawback of this process is that on an actual integrated circuit not all of the metal steps are at the same height because of the underlying topography, thus the dielectric above a metal line that forms a high step (i.e., metal over polysilicon) will be much thinner than the dielectric over a metal line that forms a smaller step (e.g., metal over an island area). Therefore, the minimum dielectric thickness between the metal levels is dependent upon the underlying topography and how well the planarization etch is controlled, which makes this process highly susceptible to shorts between the metal layers. Also, in this process the etch attacks the dielectric that is to be the electrical insulator between the metal layers which can cause pin holes resulting in shorts between metal layers.

SUMMARY OF THE INVENTION

The preferred embodiment of the present invention uses planarized dielectric layers in a multilevel, metal-insulator structure on semiconductor wafers which are used in the fabrication of integrated circuits. Two dielectric layers which are conformal to the underlying topography are deposited on a semiconductor wafer having the patterns and layers necessary for an integrated circuit up through the first level of metal. The first dielectric layer is the primary electrical insulator between the metal levels. The thickness and dielectric constant of this first dielectric layer determines the maximum capacitance between the metal layers. The purpose of the second dielectric layer is to fill the trench between the first level metal lines. The second dielectric is deposited to a thickness close to the height of the highest step of the underlying topography (metal, polysilicon and island steps) that is to be planarized. A property of the second dielectric is that it can be etched at a substantially faster rate than the first dielectric layer. The wafer is then spin coated with an organic polymer so that the top surface of the polymer is substantially flat. The structure is then plasma etched under conditions such that the etch rates of the organic polymer and the second dielectric are substantially equal. As the unpatterned polymer is removed, the second dielectric layer over metal steps is exposed to the plasma etch. Since the etch rate of the polymer and the second dielectric are equal, the second dielectric is removed from the top of the steps. The second dielectric is not etched between the steps since it is protected by the polymer. The etch is stopped when all of the polymer is substantially removed.

DETAILED DESCRIPTION OF THE INVENTION

Figure 1A:
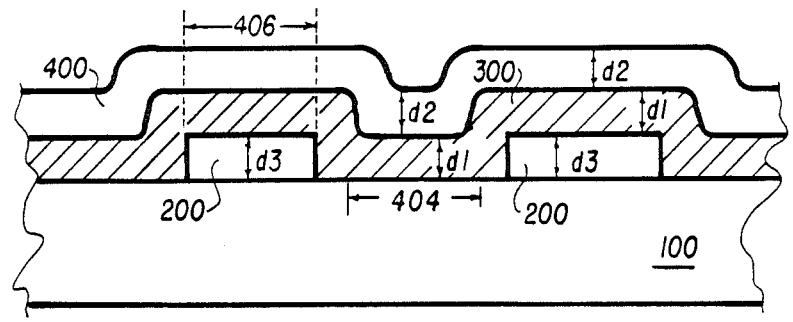
FIG. 1A shows a cross-section of a preferred embodiment of the present invention.

FIG. 1A shows a cross-section of a preferred embodiment of the present invention. A pattern of metal steps 200, typically made of aluminum having a typical thickness d3 of 0.75 microns ±10 percent is formed on wafer 100 by conventional deposition and etching methods, such as sputtering and dry etching, respectively. Although underlying topography can be present on an integrated circuit and can therefore affect the relative step heights 200, it does not change the planarization process disclosed in the present invention and has therefore been omitted from wafer 100 in the figures. A first dielectric layer 300 is deposited over wafer 100 and metal steps 200 by conventional methods, such as chemical vapor deposition (CVD) or plasma enhanced chemical vapor deposition (PECVD). First dielectric layer 300 is typically made of PECVD silicon oxynitride having a typical refractive index of 1.51±0.03 and a typical thickness d1 of 0.7 microns ±10 percent. Other materials, such as silicon dioxide can also be used for first dielectric layer 300. A second dielectric layer 400 is then deposited over first dielectric layer 300. Second dielectric layer 400 is typically made of PECVD silicon nitride having a typical refractive index of 2.03±0.05 and a typical thickness d2 of 0.85 microns ±10 percent. The thickness d2 of the second dielectric layer 400 located within region 404 is approximately equal to or greater than the thickness d3 of the metal steps 200 within region 406. As will be discussed later, because d3 is approximately equal to d2 and the first dielectric layer 300 is substantially conformal to metal steps 200, a substantially flat surface across the first dielectric layer 300 over the metal steps 200 and the second dielectric layer 300 in region 404 after etching can be produced.

Figure 1B:
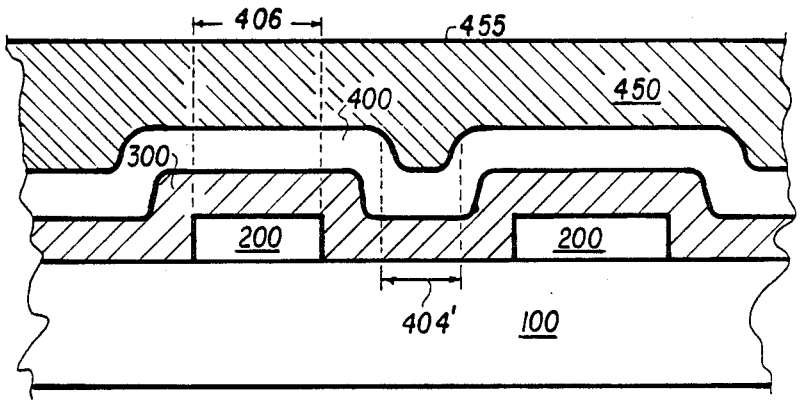
FIG. 1B shows the cross-section illustrated in FIG. 1 after further processing.
Figure 1C:
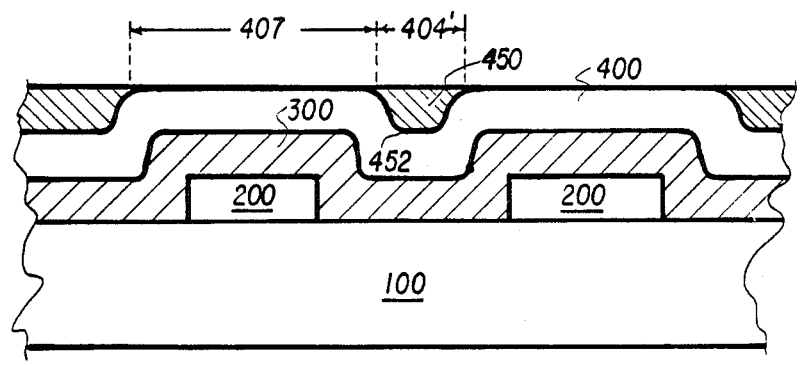
FIG. 1C shows the cross-section illustrated in FIG. 1B after further processing.

FIG. 1B shows the cross-sectional view illustrated in FIG. 1A after further processing. An organic polymer layer 450 is coated over the second dielectric layer 400, producing a substantially flat polymer surface 455. Polymer coating 450 (typically AZ 1350J-SF positive photoresist available from American Hoechst Corp.) is baked on a hot plate at 120 degrees celsius for 50 seconds. The structure is then etched using a Tegal 701 plasma etcher (available from Tegal Corp.) in a gas mixture of $SF_6$ and $O_2$ whose partial pressures are set at 0.25 torr and 0.5 torr. The partial pressures of the $SF_6$ and $O_2$ are selected such that the organic polymer coating 450 and the second dielectric layer 400 will etch at approximately the same rate. Typically the etch rate of the organic polymer coating 450 and the second dielectric layer 400 will thereby be selected in the range of 210 to 230 Angstroms per second, but etch rates in the range of 5 to 500 Angstroms per second can also be used effectively. Initially, only the polymer coating 450 is etched away. As the etch continues, the polymer coating 450 is etched away over the steps in region 407, exposing the second dielectric layer 400 in this region as shown in FIG. 1C. At this point, the polymer 450 still fills the trench shown in region 452. As the etch continues, both the second dielectric layer 400 in region 407 and the polymer 450 in region 452 are etched.

Figure 1D:
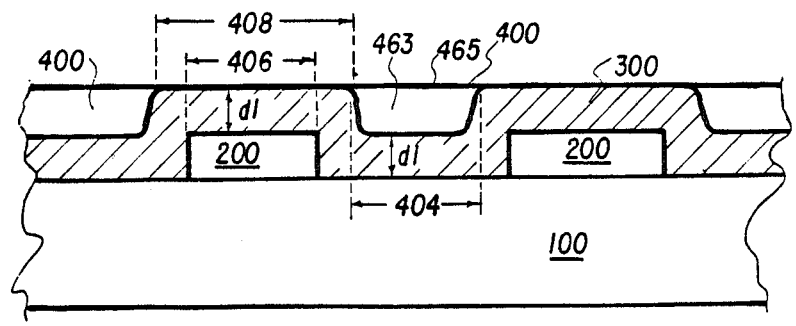
FIG. 1D shows the cross-section illustrated in FIG. 1C prior to further processing.

As further shown in FIG. 1D, the etch is continued until essentially all of the polymer coating 450 in region 404′ is removed as determined by using the "slope mode" available on the Tegal 701 plasma etcher. Almost all of the second dielectric layer 400 is left over the first dielectric layer 300 between the steps in region 463. Thus, the top of the second dielectric layer 400 in region 463 is substantially equal in height to the top of the first dielectric layer 300 in region 408, producing a substantially flat surface 465.

Using the method previously described, the etch rate of the first dielectric layer 300 will typically be selected in the range of 38 to 46 Angstroms per second, and can also be set effectively between 1 and 100 Angstroms per second. The etch rate of the first dielectric layer 300 is thus selected to be substantially slower than the etch rate of the second dielectric layer 400, typically five times slower. Because of the very slow relative etch rate of the first dielectric layer 300 and because it is only exposed toward the end of the etch process, the first dielectric layer 300 is only slightly etched (e.g., on the order of 300 Angstroms) leaving the thickness d1 substantially unchanged as shown in FIG. 1D. Thus, the first dielectric 300 remains essentially intact and the problems of nonuniformities and the formation of pin holes are minimized. In addition, planarization is independent of the spacing of the underlying steps 200 because of the use of an organic polymer to provide a flat reference surface 455.

What is claimed is:

1. A method for producing a semiconductor structure over a substrate having a pattern thereon, said pattern comprising mesa-like portions having a trench region therebetween, the steps comprising:
    forming a first layer over the mesa-like portions and trench region, the first layer over the mesa-like portions having a first thickness;
    forming a second layer over said first layer, said second layer over the trench region having a second thickness, the second thickness being approximately equal to or greater than the height of the mesa-like portions;
    forming a polymer layer over the second layer;
    etching the polymer layer to expose the second layer over the mesa-like portions and leaving a portion of the polymer layer over the trench region; and
    etching the second layer to expose the first layer over the mesa-like portions and leaving a portion of the second layer over the first layer in the trench region so that the exposed first layer over the mesa-like portions and the portion of the second layer over the first layer in the trench region creates a substantially planar surface.

2. A method as in claim 1 wherein the first layer comprises silicon oxynitride.

3. A method as in claim 2 wherein the second layer comprises silicon nitride.

4. A method as in claim 3 wherein the polymer layer has a substantially planar surface.

5. A method as in claim 3 wherein the polymer layer has a first etch rate and the second layer has a second etch rate, the first and second etch rates being substantially equal.

6. A method as in claim 1 wherein the mesa-like portions have a thickness which is substantially equal to the second thickness.

7. A method as in claim 1 wherein the second layer comprises silicon nitride.

8. A method as in claim 7 wherein the first layer has a first etch rate in the range of 1 to 100 Angstroms per second and the second layer has a second etch rate in the range of 5 to 500 Angstroms per second.

9. A method as in claim 1 wherein the mesa-like portions have a thickness of 0.75 microns ±10 percent, the first thickness is 0.7 microns ±10 percent and the second thickness is 0.85 micron ±10 percent.

* * * * *